United States Patent [19]

Eskandari-Gharnin et al.

[11] Patent Number: 5,602,764
[45] Date of Patent: Feb. 11, 1997

[54] COMPARING PRIORITIZING MEMORY FOR STRING SEARCHING IN A DATA COMPRESSION SYSTEM

[75] Inventors: Bijan Eskandari-Gharnin, Littleton; Galen G. Kerber, Northglenn, both of Colo.

[73] Assignee: Storage Technology Corporation, Louisville, Colo.

[21] Appl. No.: 171,705

[22] Filed: Dec. 22, 1993

[51] Int. Cl.$^6$ .................................................. G06F 7/00
[52] U.S. Cl. .................. 364/715.09; 395/435; 341/55; 365/49
[58] Field of Search ............................ 395/400, 425, 395/435, 600; 364/715.09; 365/49; 341/55, 51

[56] References Cited

U.S. PATENT DOCUMENTS

| | | | |
|---|---|---|---|
| 4,701,745 | 10/1987 | Waterworth | 340/347 DD |
| 4,906,991 | 3/1990 | Fiala et al. | 341/51 |
| 4,907,194 | 3/1990 | Yamada et al. | 365/49 |
| 4,959,811 | 9/1990 | Szczepanek | 365/49 |
| 5,003,307 | 3/1991 | Whiting et al. | 341/51 |
| 5,016,009 | 5/1991 | Whiting et al. | 341/67 |
| 5,036,486 | 7/1991 | Noguchi et al. | 365/49 |
| 5,049,881 | 9/1991 | Gibson et al. | 341/95 |
| 5,051,745 | 9/1991 | Katz | 341/51 |
| 5,053,991 | 10/1991 | Burrows | 365/49 |
| 5,155,484 | 10/1992 | Chambers, IV | 341/55 |
| 5,369,605 | 11/1994 | Parks | 364/715.09 |
| 5,394,353 | 2/1995 | Nusinov et al. | 365/49 |
| 5,469,161 | 11/1995 | Bezek | 341/51 |
| 5,485,526 | 1/1996 | Tobin | 382/232 |
| 5,497,488 | 3/1996 | Akizawa et al. | 395/600 |

*Primary Examiner*—Eddie P. Chan
*Assistant Examiner*—Hiep T. Nguyen
*Attorney, Agent, or Firm*—Sterne, Kessler, Goldstein & Fox P.L.L.C.

[57] ABSTRACT

A method and apparatus that allows very fast string searches, wherein a new type of data structure called a Comparing and Prioritizing (CAP) Memory is utilized. The CAP memory allows data stored therein to be string searched at high speeds. That is, the CAP memory provides the ability to sequentially determine one or more locations of strings that exist in its data memory that are identical to a string in an incoming data stream. In a preferred embodiment, the output of the CAP memory is used for data compression.

15 Claims, 2 Drawing Sheets

COMPARING PRIORITIZING MEMORY FOR STRING SEARCHING IN A DATA COMPRESSION SYSTEM

BACKGROUND OF THE INVENTION

1. Field of the Invention

The invention relates generally to data storage and communication systems and, more particularly, to a comparing and prioritizing memory that allows data stored therein to be string searched, wherein the results of the string search are used for data compression.

2. Related Art

Many tasks such as data compression and database searches, and many optimization techniques involve searching a data buffer for strings that match a given string. The speed of these tasks (e.g., data compression) is often directly proportional to the speed at which these matching strings can be located.

Finding the set of strings that match a given string is a computationally intense task. Typically, to find the strings that match a given string of length M in a buffer of length N, a maximum of M*N comparisons need to be performed. If these comparisons occur sequentially, a maximum of M*N cycles are required. However, if many of these comparisons could be performed in parallel, say N comparisons at a time, a maximum of only M cycles would be required.

There are a number of data compression algorithms that involve searching for matching strings that have good compression characteristics. However, these algorithms are typically not implemented because they are too computationally intense. Examples are the original Ziv and Lempel compression algorithm LZ1 (see, Jacob Ziv and Abraham Lempel, "A Universal Algorithm for Sequential Data Compression," IEEE Transactions on Information Theory, Vol. IT-23, No. 3, May 1977, pp. 337–343) and a compression algorithm by James Storer and Thomas Szymanski (see, James A. Storer and Thomas G. Szymanski, "Data Compression via Textual Substitution," Journal of the Association for Computing Machinery, Vol. 29, No. 4, October 1982, pp. 928–951). Both algorithms are based on the principal of finding redundant strings within a search window and encoding them with pointers that contain the length and location of that string in the search window.

A second data compression algorithm of Ziv and Lempel LZ2 (see, Jacob Ziv and Abraham Lempel, "Compression of Individual Sequences via Variable-Rate Coding," IEEE Transactions on Information Theory, Vol. IT-24, No. 5, September 1978, pp. 530–536), provides variable length to variable length encoding. It continuously compares the input stream against words contained in a dictionary, and returns pointers to the dictionary entry of the longest match. The dictionary growth heuristic implied by the addition of the last parsed word concatenated with the first unmatched symbol causes the dictionary to contain every prefix of every word it holds. Although implementation of this algorithm is not computationally intensive, it yields a lower compression ratio than the original Ziv and Lempel compression algorithm.

Other string search methods employ hashing or tree techniques. In hashing, a hashing table is maintained to limit the locations that are searched. However, in the case where many strings start with the same sequence, many comparisons still need to be made, resulting in performance degradation.

Tree based systems maintain a tree structure that is traversed to identify the existence and location of strings in the history buffer. The disadvantage of tree based systems is the overhead of adding and deleting tree entries which can significantly degrade performance.

An apparatus that is often used to speed up searches is a Content Addressable Memory (CAM). A CAM can return the location of a given word in a single memory access. A word is presented to the CAM, and the CAM performs a simultaneous compare between the given word and all locations in the CAM. If the word is present in any of its locations, the CAM returns the address of one of the matched locations. This makes the CAM an excellent apparatus to search for a single word in a buffer. However, it is not possible to use a CAM to search strings that are longer than a single word.

SUMMARY OF THE INVENTION

The present invention provides a method and apparatus that allows very fast string searches, wherein a new type of data structure called a Comparing and Prioritizing (CAP) Memory is utilized. The CAP Memory provides the ability to sequentially determine the location(s) of string(s) that exist in its data memory that are identical to a string in an input data string. The CAP memory consists of a data memory, compare logic, match continue logic, a match memory, a hold memory, and a priority encoder.

An input data string is written to the CAP memory one unit of data (e.g., byte) at a time while this unit of data is simultaneously compared to the current contents of the data memory. The results of this comparison are then used together with the contents of the hold memory to determine a value to store in the match memory.

In a preferred embodiment, the CAP memory is used in the compression of data. The outputs of the CAP memory include a match continue signal, a match address bus, and match signal. These three signals are used by a data compression module to compress the input data string. The data compression module encodes the matching strings with their location (p) and the length (1) of the string. When an input unit from the input data string is received, if there is no match, the CAP memory forwards the non-matching input unit directly to the data compression module.

In operation, a one is always stored in the match memory location associated with the longest current matching strings, and a zero otherwise. If the CAP memory is not in the middle of a match, or if the CAP memory was in the middle of a match, but the match does not continue with the current input unit from the input data string, then the CAP memory will attempt to start a new match by locating all matches between the data memory and the current unit of data from the input string. If there is a match, the associated match memory locations are set to a logical one.

If the CAP memory is in the middle of a match or matches, and the next input unit from the input data string continues at least one of those matches, then the CAP memory will continue the match or matches by locating all matches between the data memory and the next unit of data from the input string. If there is a continuing match, the associated match memory locations are set to a logical one. Whenever a match continues, the match continue signal is asserted. This procedure is repeated for all units of data from the data input string in order to match all identical strings between the data input string and the current contents of the data memory.

During each iteration, the addresses of the matches in the match memory are prioritized and the address of a selected match is placed on the match address bus. In a preferred embodiment, the priority encoder selects the lowest address and places it on the address bus. The match signal is asserted if there are any matches present in the match memory. The outputs of the CAP memory (match continue signal, match address bus, and match signal) provide sufficient information to therefore encode a matched string to a pointer of (p, l), where "p" is the position of the first or last character in the matched string, and "1" indicates the length of the matched string. This encoded information is used for compressing the data input string.

BRIEF DESCRIPTION OF THE FIGURES

The foregoing and other features and advantages of the invention will be apparent from the following more particular description of preferred embodiments of the inventjori; as illustrated in the accompanying drawings, in which.

DETAILED DESCRIPTION OF THE PREFERRED EMBODIMENTS

Figure 2:
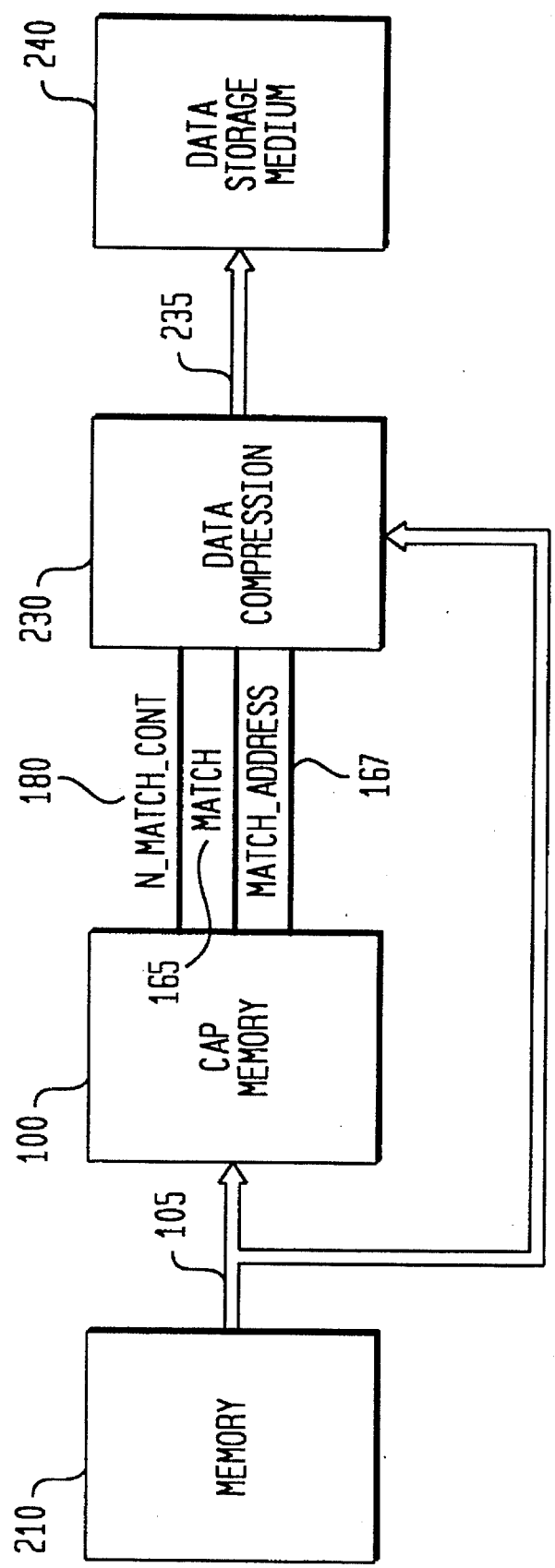
FIG. 2 shows a high level block diagram of the environment in which the present invention operates.

FIG. 2 shows a high level block diagram of the environment in which the present invention operates. In a computer-based environment, data is stored in a memory 210 such as a RAM. It is often desirable to store the dam in memory 210 onto a data storage medium 240 such as a tape or disk. The data is often compressed by a data compression module 230 before it is stored onto the data storage medium 240.

In order to compress data it is necessary to analyze an input string 105 of data (from memory 210), and find repeated strings of data within the input string 105. The repeated instances of strings are replaced with codewords that contain pointers to other occurrences of the same strings. The output of data compression module 230 is compressed data 235 that contains the string characters and pointers representing the subsequent occurrences of the same string. In order to perform this task, the present invention provides a comparing and prioritizing (CAP) memory 100 that allows high speed string searches. The output from the CAP memory 100, described below, is used by the data compression module 230 to compress the input string 105.

The discussion below is presented in two sections. The first section provides a structural description of the CAP memory 100. The second section provides a derailed operational description of the CAP memory 100.

A. Structural Description of CAP Memory 100

Figure 1:
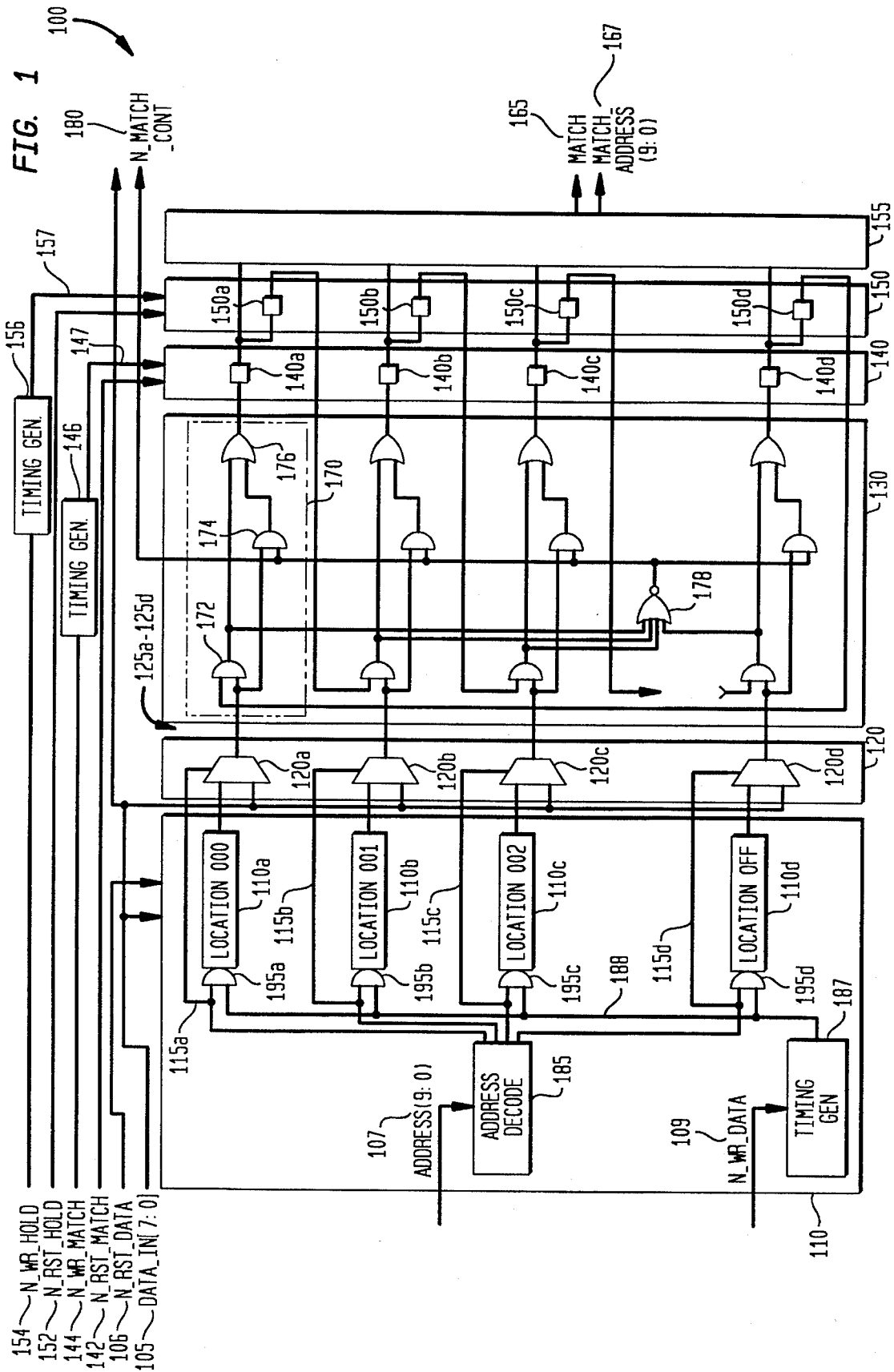
FIG. 1 is a schematic of a comparing and prioritizing memory constructed in accordance with a preferred embodiment of the invention.

FIG. 1 illustrates a schematic of the CAP memory 100 constructed in accordance with a preferred embodiment of the present invention. The CAP Memory 100 provides the ability to sequentially determine the location(s) of string(s) that exist in its data memory 110 that are identical to a string in an incoming data stream 105. The results of the string search are used for dam compression.

The CAP memory 100 consists of data memory 110, compare logic 120, match continue logic 130, match memory 140, hold memory 150, and priority encoder 155. An input string 105 is presented to the CAP memory 100 (e.g., from a RAM) for comparison with previously stored dam. The output of the CAP memory 100 is used to store data onto the data storage medium 240 in a compressed form. That is, searching for strings that are identical to data in the incoming data steam 105 allows replacement of the repeated strings (i.e., data) with codewords that occupy a smaller amount of space.

The data memory 110 is implemented as a linear array of symbol values indexed with positive integers starting from a base of 0. The length of the data memory 110 is fixed at a certain value. Preferably the length of the dam memory is fixed to a power of 2. In a preferred embodiment, a 1024 by 8-bit (byte) data memory 110 provides an excellent compromise, considering the implementation real estate, string search speed, and compression ratio.

Data is written to the data memory 110 based on an address that is supplied via address line 107. The address 107 is decoded by an address decoder 185. Each data memory location 110a–110d has an associated AND gate 195a–195d attached thereto. The output of address decoder 185 provides a logical one to the input of the AND gate 195a–195d that is associated with the data memory location where the data on line 105 should be written. Address decoding is well known in the computer art.

The other input to the AND gates 195a–195d is connected to a timing generator 187. The output of the timing generation block 187 is a write pulse 188. The write pulse allows the data to be written in the proper location addressed by address 107. A control line N_WR_DATA 109 acts as an input to the timing generation block 187. If the data on line 105 is intended to be written to data memory 110, the control line N_WR_DATA 109 is active low. Conversely, if the data on line 105 is not intended to be written to data memory 110, the control line N_WR_DATA 109 is active high. When both inputs to one of the AND gates 195a–195d are logical one, the output of that AND gate 195a–195d activates the write enable of the associated data memory location 110a–110d.

Numerous alternative decoding schemes could be implemented in place of decoder 185 and AND gates 195a–195d as should be apparent to those skilled in the art.

Each data memory location 110a–110d has an associated comparator 120a–120d. In the preferred embodiment, each comparator 120a–120d is 8-bits wide and is used to compare the contents of that data memory location 110a–110d with the input data 105. If the content of a data memory location 110a–110d matches the input data 105, the associated compare logic output 125a–125d will be true (i.e., logical one).

The output of the comparator 120a–120d is disabled for the data memory location 110a–110d being addressed, i.e., the data memory location 110a–110d where the data on line 105 is to be written. For example, if a word from input string 105 is written to memory location 110c, then comparator 120c is disabled via line 115c. This scheme provides the ability to perform simultaneous compare and write cycles, thus allowing the CAP memory 100 to run at its optimum pipeline rate.

The match continue logic 130 is used to determine if a match is a single location long, or it is part of a longer match. The match continue logic 130 uses the previous match results from the hold memory 150 together with the outputs of the compare logic 120 to make this determination. The structure and operation of the match control logic 130 is described in greater detail below.

Each data memory location 110a–110d also has an associated match memory cell 140a–140d. In the preferred embodiment, the match memory cells 140a–140d can be made of latches, or any array of single bit wide RAM. The match memory 140 stores the current results of the match process. Each match memory cell 140a–140d which is at the end of a currently matched string will contain a one, and all others will contain a zero. Each match memory cell 140a–140d has an address which corresponds to a memory location 110a–110d in data memory 110.

Timing generator 146 controls when data is written to match memory 140. The output of the timing generator 146 is a write pulse 147. An active low control line N_WR_MATCH 144 acts as an input to the timing generator 146.

Each match memory cell 140a–140d has an associated hold memory cell 150a–150d. In the preferred embodiment, the hold memory cells 150a–150d can be made of latches, or any array of single bit wide RAM. The purpose of the hold memory 150 is to hold the values from the match memory 140 that feed back into the match memory 140 via the match continue logic 130 in order to prevent race conditions.

Timing generator 156 controls when data is written to hold memory 150. The output of the timing generator 156 is a write pulse 157. An active low control line N_WR_HOLD 154 acts as an input to the timing generator 156.

Outputs of the match memory cells 140a–140d feed the priority encoder 155. The priority encoder 155 prioritizes matches in the case of multiple matches and can select one of many matches. In the preferred embodiment, the priority encoder 155 can encode up to 1024 matches and selects the lowest address containing a match.

The results of the matches are prioritized by the priority encoder 155 and the address of the lowest match will be placed on the match address bus MATCH_ADDRESS 167. If there are any matches present in the match memory 140, the match signal (MATCH) 165 is also asserted. The outputs of the CAP memory (i.e., match continue signal (N_MATCH_CONT) 180, match address bus (MATCH_ADDRESS) 167, and match signal (MATCH) 165) provide sufficient information to therefore encode a matched string to a pointer of (p, 1), where "p" is the position of the first or last character in the matched string, and "1" indicates the length of the matched string. In a preferred embodiment, the "p" is the position of the last character in the matched string.

Note that although only four memory locations, four comparators, four match memory cells, and four hold memory cells are shown in FIG. 1, the preferred embodiment contains 1024 of each element shown in FIG. 1 (e.g., a preferred embodiment includes 1024 hold memory cells). Furthermore, as will become apparent to those skilled in the art, the data memory 110 can be any size. Of course, as the memory size increases so does the number of elements in the compare logic 120, the match continue logic 130, the match memory 140, the hold memory 150, and the priority encoder 155.

Each data memory location 110a–110d has an associated match continue logic cell. For example, data memory location 110a is associated with match continue logic cell 170. For simplicity, only match continue logic cell 170 is described below. Match continue logic cell 170 includes a first AND gate 172, a second AND gate 174, and an OR gate 176.

The first AND gate 172 has two inputs. The first input is connected to the hold memory latch associated with the previous match continue logic cell. In this example, since the match continue logic cell 170 is the first cell in the match continue logic 130, the first input of the first AND gate 172 is connected to hold latch 150d. The second input is connected to the output of the compare logic 120. In this example, the second input is connected to comparator 120a.

The first AND gate in the match continue logic cells (e.g., 170) are referred to below as the "first level" AND gates.

The second AND gate 174 also has two inputs. The first input is connected to the output of the compare logic 120. In this example, the first input is connected to comparator 120a. The second input of the second AND gate 174 is connected to the output of NOR gate 178 (described below). The second AND gate in the match continue logic cells (e.g., 170) are referred to below as the "second level" AND gates.

The output from the first AND gate 172 and the second AND gate 174 are used as inputs to the OR gate 176. The output of the OR gate 176 is connected to the match memory 140. In this example, the output from the OR gate 176 is connected to match memory cell 140a.

The match continue logic 130 also has a NOR gate 178. The outputs from the first level AND gates are all connected to the input of the NOR gate 178. The output of the NOR gate 178 is connected to the second input of the "second level" AND gates. The output of the NOR gate 178 is also referred to as match continue signal N_MATCH_CONT 180. The match continue signal N_MATCH_CONT 180, which is active low, indicates that the CAP memory 100 is in the middle of a match or matches, and the current input data 105 continues at least one of those matches. The match continue signal N_MATCH_CONT 180 will be asserted since the match is continuing.

As would be apparent to those skilled in the relevant art, the match continue logic 130 can take many forms so long as the functionality remains the same. As such, the present invention contemplates logic circuits other than what is shown in FIG. 1.

B. Operational Description

As discussed above, the CAP memory 100 can be used in a system that is concerned with the compression of dam. The outputs from the CAP memory, namely match continue signal (N_MATCH_CONT) 180, match address bus (MATCH_ADDRESS) 167, and match signal (MATCH) 165 contribute to the successful compression of dam. Described below is an operational description of CAP memory 100. Compression of data will be discussed subsequent to the operational description of CAP memory 100.

As discussed above, the CAP memory provides a mechanism for sequentially determining the location(s) of string(s) that exist in its data memory (i.e., the data memory 110). The input data string 105 is written to the data memory 110 one symbol (e.g., data word) at a time while it is also simultaneously compared to the contents of the data memory 110.

Initially, there is no data stored in the CAP memory 100. The data memory 110, the match memory 140, and the hold memory 150 are initialized via reset lines N_RST_DATA 106, N_RST_MATCH 142, and N_RST_HOLD 152, respectively. In a preferred embodiment, active low on these reset lines will cause the respective elements to be cleared. A data word 105 and an address 107 are supplied to the CAP memory 100.

In a preferred embodiment, the starting address is location zero. Subsequently, the address is incremented by one. Thus, the data from data line 105 is written to the data memory 110 sequentially starting at address zero. Once the end of the data memory 110 is reached, a preferred embodiment once again starts storing data at address location zero (i.e., data memory location 110a). This allows the present invention to store the last 1024 bytes of data from input string 105. As would be apparent to a person skilled in the relevant art, the starting address can be any location in data memory 110 so long as the addresses are incremented by a predefined manner thereafter.

During the write operation, the data 105 is simultaneously compared with the data already stored in data memory 110. The results of this comparison are output as the match continue signal (N_MATCH_CONT) 180, an address on match address bus (MATCH_ADDRESS) 167, and the match signal (MATCH) 165.

In operation, once a unit of data from the input data string 105 has been received, the match continue logic 130 resolves three conditions: (1) the CAP memory 100 is not in the middle of a match; (2) the CAP memory 100 was in the middle of a match, but the match does not continue with the current input value; and. (3) the CAP memory 100 is in the middle of a match or matches, and the current input value continues at least one of those matches.

The first state: the CAP memory 100 is not in the middle of a match. In other words, the next word in the input string 105 is the first word to be searched as part of a string. The match continue logic 130 outputs any match between input data 105 and the entire data memory 110.

When the CAP memory 100 is in its first state, the hold memory 150 contains all zeros because there is no previous match. Therefore, the output of all "first level" AND gates (e.g., AND gate 172) is zero, feeding zeroes into the output OR gates (e.g., OR gate 176). Furthermore, because all of the "first level" AND gates have zero outputs, the output of NOR gate 178 will be a logical one. Thus, the active low match continue signal N_MATCH_CONT 180 is not asserted.

Since the output of NOR gate 178 is logical one, the "second level" AND gates (e.g., AND gate 174) will output a logical one if the associated comparator 120a–120d indicates a match. As a result, if there is a match, a logical one is stored in the associated match memory 140. That is, if compare logic 120 indicates a match, the output of the associated "second level" AND gate also indicates a match by outputting a logical one.

The output of the OR gate indicates whether there has been a match between the input data 105 and the associated data memory location 110a–110d. If there has been a match, a logical one is stored in the associated match memory cell 140a–140d. If no match is found, a logical zero is stored in the associated match memory cell 140a–140d.

The second state: the CAP memory was in the middle of a match, but the match does not continue with the current input value. The match continue logic 130 outputs any match in the entire data memory 110.

The output of all "first level" AND gates is logical zero, feeding zeroes into the output OR gates. That is, the output of the "first level" AND gates is logical zero if either (1) the output 125a–125d of comparators 120a–120d is logical zero (indicating that there are no matches between data memory 110 and input string 105), or (2) the output of one or more comparators in compare logic 120 is a logical one (indicating there is a match between data memory 110 (e.g., 110a) and input string 105), but the associated previous hold memory 150 (e.g., 150d) has a value of zero (indicating that the match does not continue). Since all of the "first level" AND gates have logical zero outputs, the output of the NOR gate 178 will be a one, enabling via the "second level" AND gates any match to be output. The active low match continue signal N_MATCH_CONT 180 will not be asserted. The first state described above is a subset of this state.

The third state: the CAP memory 100 is in the middle of a match or matches, and the current input value continues at least one of those matches. The match continue logic 130 outputs only the matches that continue.

If there are any continuing matches, then at least one of the "first level" AND gates will have an output of one. In other words, since there was a previous match, hold memory 150 will have at least one latch that contains a logical one (e.g., 150d). Furthermore, since the match is continuing there is at least a match between data line 105 and data memory 110. This match results in the output of at least one of the comparators 120a–120d to be a logical one. Since the match is continuing, one of the associated previous hold memory locations will contain a logical one, which in turn results in the corresponding "first level" AND gate to output a logical one. As a consequence, the output of the NOR gate 178 will be a zero.

The continuing matches (i.e., the output of the "first level" AND gates) feed directly into the output OR gates (e.g., OR gate 176), and all other matches are disabled. The active low match continue signal N_MATCH_CONT 180 is asserted since the match is continuing. That is, since the output of NOR gate 178 is logical zero, the match continue signal N_MATCH_CONT 180 will indicate that the match is continuing.

If there is more than one matching string, priority encoder 155 selects among the matching strings based on a predetermined characteristic. A matched string is selected by priority encoder 155 and is encoded by the dam compression module 230 as codewords representing the string by its location and length in the data memory 110. In a preferred embodiment, the match continue signal (N_MATCH_CONT) 180 is used by the data compression module 230 as an input to a counter (not shown) that determines the length of the matched string. Also in a preferred embodiment, the match address 167 corresponding to the end of a matching string, as determined by the match continue signal (N_MATCH_CONT) 180 and the counter, are encoded by data compression module 230 as compressed data 235.

Those skilled in the art will recognize that with a proper pipelining technique in the match continue logic 130 and the priority encoder 155, string search speed can be optimized. The present invention with an optimum pipelining technique can produce string search speeds of 50 Mbytes/Sec., when state of the art technology such as 0.5 micron CMOS standard cell technology is used.

Referring to FIG. 2, the CAP memory 100 is an element in the compression process. The CAP memory 100, through a string search, will locate repeated strings in the input string 105. The outputs of the CAP memory 100, match continue signal (N_MATCH_CONT) 180, match address bus (MATCH_ADDRESS) 167, and match signal (MATCH) 165, are used by dam compression module 230 to compress the input string 105 from memory 210. Using these three outputs, the data compression module 230 encodes the matching strings with their location (p) and the length (1) of the string. If there is no match, the CAP memory 100 forwards the non-matching input symbol directly to the data compression module 230 via line 105.

As discussed in the background section, data compression is well known in the art, and the logic necessary for data compression module 230 to utilize match signal (MATCH) 165, match address bus (MATCH_ADDRESS) 167, and match continue signal (N_MATCH_CONT) 180 would be apparent to a person skilled in the relevant art.

While embodiments of the present invention have been described above, it should be understood that they have been presented by way of example only, and not limitation. Thus, the breadth and scope of the present invention should not be limited by any of the above described embodiments, but should be defined only in accordance with the following claims and their equivalents.

What is claimed is:

1. A comparing and prioritizing memory configured to accept an incoming string of data, comprising:

(a) data memory having a plurality of memory locations each for storing a unit of data from the incoming string of data;

(b) a plurality of comparators (1, 2, . . . n) each having an output, wherein each of said memory locations in said data memory is coupled to a different comparator, wherein said output of each of said plurality of comparators indicates whether there is a match between said unit of data in said incoming string of data and data already stored in said data memory;

(c) match continue logic, connected to said plurality of comparators, to determine whether a match indicated at said output of each of said plurality of comparators is a single unit long or is part of a match that contains a continuous string of multiple units, wherein said match continue logic includes a plurality of match continue logic cells (1,2, . . . ,n), each match continue logic cell having a first input coupled to a corresponding one of said comparators;

(d) a match memory including a plurality of match memory cells (1, 2, . . . n), wherein said plurality of match memory cells store an indication of a match as determined by said match continue logic, each match memory cell having an input coupled to all output a corresponding match continue logic cell and an output coupled to a second input of a next succeeding match continue logic cell, wherein the output of the last match memory cell (n)is coupled to the second input of the first match continue logic cell (1); and (e) a priority encoder, connected to said plurality of match memory cells, for prioritizing matches if said plurality of match memory cells indicate two or more matches, and for outputting a match signal.

2. The comparing and prioritizing memory of claim 1, further comprising a hold memory including a plurality of hold memory cells connected to said plurality of match memory cells and said match continue logic, wherein each of said plurality of hold memory cells is associated with one of said plurality of match memory cells.

3. The comparing and prioritizing memory of claim 2, wherein said match continue logic comprises:

a NOR gate having a plurality of inputs and an output;

a plurality of first level AND gates each having a first input, a second input, and an output;

a plurality of second level AND gates each having a first input, a second input, and an output; and a plurality of OR gates each having a first input, a second input, and an output;

wherein said first inputs of said first level AND gates are connected to said hold memory and said second inputs of said first level AND gates are connected to said output of said plurality of comparators, said outputs of said first level AND gates are connected to said plurality of inputs of said NOR gate, said first inputs of said second level AND gates are connected to said output of said plurality of comparators and said second inputs of said second level AND gates are connected to said outputs of said NOR gate, said first inputs of said OR gates are connected to said outputs of said first level AND gates and said second input of said OR gates are connected to said outputs of said first level AND gates and said second inputs of said OR gates are connected outputs of said second level AND gates, and said outputs of said OR gates are connected to said match memory.

4. The comparing and prioritizing memory of claim 1, wherein said match continue logic outputs a match continue signal and said priority encoder further outputs a match address signal, wherein said match signal, said match address signal and said match continue signal are used for data compression.

5. In a system that includes a comparing and prioritizing (CAP) memory, wherein the CAP memory comprises data memory, compare logic, match continue logic, match memory, and priority encoder, a method of sequentially determining the location(s) of string(s) that exist in the CAP memory that are identical to a string in an incoming data stream, comprising the steps of:

(1) writing a unit of data from an input data string to the data memory;

(2) comparing, simultaneously with said writing of said unit of data, said unit of data from said input data string with current contents of the data memory;

(3) determining a set of values to store in the match memory by using the results of said comparison together with the current contents of the match memory, wherein a first value is stored in a match memory location associated with a longest currently matched string(s), and a second value otherwise, wherein said determining step comprises the steps of:

(i) if the CAP memory is not in the middle of a match or a CAP memory was in the middle of the match, but the match does not continue with said unit of data from said input data string, then the CAP memory will start a new match by locating all matches between the data memory and said unit of data from said input data string and setting associated match memory locations to said first value, otherwise the associated match memory locations are set to a second value; and (ii) if the CAP memory is in the middle of a match(es), and said unit of data from said input data string continues at least one of those matches, then the CAP memory will continue the match(es) by locating all matches that continue and setting the associated match memory location to said first value.

6. The method of claim 5, further comprising the step of repeating steps (1) through (3) for subsequent units of data from said input data string.

7. The method of claim 5, further comprising the step of prioritizing results of said steps (1) through (3) if there is more than one match.

8. The method of claim 7, wherein said step of prioritizing includes selecting a match having a lowest address within said match memory.

9. The method of claim 5, wherein the CAP memory provides information that allows a data compression system to encode a currently matched string to a pointer that indicates the position of a last character in a currently matched string and a length of the currently matched string.

10. The method of claim 5, wherein the CAP memory provides information that allows a data compression system to encode a currently matched string to a pointer that indicates a position of the first character in a currently matched string and a length of the currently matched string.

11. A data compression system, comprising:

(a) a memory unit configured to store data;

(b) a comparing and prioritizing memory, connected to said memory unit, configured to accept an input string, said comparing and prioritizing memory includes, (I) a data memory having a plurality of memory locations each for storing said input string;

(ii) a plurality of comparators (1,2, ... n) each having an output, wherein each of said memory locations in said data memory is coupled to a different comparator, wherein said output of each of said plurality of comparators indicates whether there is a match between a unit of data in said input string of data and data already stored in said data memory;

(iii) match continue logic, connected to said plurality of comparators, for determining whether a match indicated at said output of each of said plurality of comparators is a single unit long or is part of a match that contains a continuous string of multiple units, wherein said match continue logic includes a plurality of match continue logic cells (1,2 . . . n). each match continue logic cell having a first input coupled to a corresponding one of said comparators;

(iv) match memory including a plurality of match memory cells (1.2 . . . n), wherein said plurality of match memory cells store an indication of a match as determined by said match continue logic, each match memory cell having an input coupled to an output of a corresponding match continue logic cell and an output coupled to a second input of a next succeeding match continue logic cell, wherein the output of the last match memory cell (n) is coupled to the second input of the first match continue logic cell (l); and (v) a priority encoder, connected to said plurality of match memory cells, for prioritizing matches if said plurality of match memory cells indicate two or more matches, and for selecting between said two or more matches;

wherein said comparing and prioritizing memory generates a match signal indicating a match between said unit of data and said data stored in said data memory, a match address indicating the location of said match, and a match continue signal indicating that said match is continuing;

(c) a data compression module that is configured to accept as an input said match signal, said match address, and said match continue signal, and further configured to compress said input string based on said input; and (d) a data storage medium configured to store said compressed input string.

12. The comparing and prioritizing memory of claim 1, wherein said match continue logic comprises:

a NOR gate having a plurality of inputs and an output;

a plurality of first level AND gates each having a first input, a second input, and an output;

a plurality of second level AND gates each having a first input, a second input, and an output; and a plurality of OR gates each having a first input, a second input, and an output, wherein said first inputs of said first level AND gates are connected to said match memory and said second inputs of said first level AND gates are connected to said output of said plurality of comparators, said outputs of said first level AND gates are connected to said plurality of inputs of said NOR gate, said first inputs of said second level AND gates are connected to said outputs of said plurality of comparators and said second inputs of said second level AND gates are connected to said outputs of said NOR gate, said first inputs of said OR gates are connected to said output of said first level AND gates and said second inputs of said OR gates are connected to said outputs of said second level AND gates, and said outputs of said OR gates are connected to said match memory.

13. The comparing and prioritizing memory of claim 1, further comprising an address decoder and a plurality of AND gates, each of said AND gates connected to an input of one of said plurality of comparators, wherein each AND gate has a first input and a second input, said first input is connected to a write pulse and said second input is connected to said address decoder, wherein each of said plurality of comparators has an enable connected to said address decoder, whereby an incoming unit of data can be compared with the current contents of said data memory simultaneously with the writing of a unit of data to said data memory.

14. The data compression system of claim 11, further comprising an address decoder and a plurality of AND gates, each of said AND gates connected to an input of one of said plurality of comparators, wherein each AND gate has a first input and a second input, said first input is connected to a write pulse and said second input is connected to said address decoder, wherein an enable signal of each of said plurality of comparators has an enable connected to said address decoder, whereby an incoming unit of data can be compared with the current contents of said data memory simultaneously with the writing of a unit of data to said data memory.

15. The comparing and prioritizing memory of claim 1, wherein said priority encoder generates a match signal indicating a match between said unit of data and said data already stored in said data memory and a match address indicating the location of said match, wherein said match continue logic generates a match continue signal indicating that said match is continuing.

* * * * *